US009698083B2

(12) United States Patent
Yeo

(10) Patent No.: US 9,698,083 B2
(45) Date of Patent: Jul. 4, 2017

(54) THREE-DIMENSIONAL STACK OF LEADED PACKAGE AND ELECTRONIC MEMBER

(71) Applicant: Infineon Technologies AG, Neubiberg (DE)

(72) Inventor: Alfred Swain Hong Yeo, Singapore (SG)

(73) Assignee: Infineon Technologies AG, Neubiberg (DE)

( * ) Notice: Subject to any disclaimer, the term of this patent is extended or adjusted under 35 U.S.C. 154(b) by 78 days.

(21) Appl. No.: 14/727,554

(22) Filed: Jun. 1, 2015

(65) Prior Publication Data
US 2015/0348882 A1    Dec. 3, 2015

(30) Foreign Application Priority Data

Jun. 2, 2014  (DE) .......................  10 2014 107 729

(51) Int. Cl.
H01R 9/00 (2006.01)
H01L 23/495 (2006.01)
(Continued)

(52) U.S. Cl.
CPC ........ *H01L 23/49531* (2013.01); *H01L 21/56* (2013.01); *H01L 23/49555* (2013.01); *H01L 25/16* (2013.01); *H05K 1/18* (2013.01); *H05K 3/3426* (2013.01); *H01L 23/3107* (2013.01); *H01L 23/495* (2013.01); *H01L 23/49589* (2013.01); *H01L 2224/48091* (2013.01); *H01L 2224/48247* (2013.01); *H01L 2924/181* (2013.01); *H05K 2201/1053* (2013.01); *H05K 2201/10515* (2013.01); *H05K 2201/10522* (2013.01); *H05K 2201/10689* (2013.01);
(Continued)

(58) Field of Classification Search
CPC ....... H01L 2924/00; H01L 2224/48091; H01L 2924/0002; H01L 2924/10253; H01L 2924/181; H01L 2225/1029; H01L 23/3107; H01L 23/49555; H01L 25/105; H01L 2924/00012; H01L 2924/00014; H01L 21/56; H01L 2224/48237; H01L 2224/4824
See application file for complete search history.

(56) References Cited

U.S. PATENT DOCUMENTS

| | | | |
|---|---|---|---|
| 7,622,800 B2 | 11/2009 | Ramakrishna et al. | |
| 2007/0228545 A1* | 10/2007 | Ramakrishna | H01L 25/105 257/686 |
| 2008/0227238 A1* | 9/2008 | Ko | H01L 23/552 438/108 |

FOREIGN PATENT DOCUMENTS

DE  10104708 A1  9/2001
JP  H03-173167 A  7/1991

OTHER PUBLICATIONS

Courtesy examination report for priority application DE 10 2014 107 729 and English language abstract.
English language abstract of JP H03-173167 and DE 101 047 08.

* cited by examiner

*Primary Examiner* — Yuriy Semenenko

(57) ABSTRACT

An electronic device comprising a package comprising an encapsulated electronic chip, at least one at least partially exposed electrically conductive carrier lead for mounting the package on and electrically connecting the electronic chip to a carrier, and at least one at least partially exposed electrically conductive connection lead, and an electronic member stacked with the package so as to be mounted on and electrically connected to the package by the at least one connection lead.

19 Claims, 4 Drawing Sheets

(51) Int. Cl.
*H01L 21/56* (2006.01)
*H01L 25/16* (2006.01)
*H05K 1/18* (2006.01)
*H05K 3/34* (2006.01)
*H01L 23/31* (2006.01)

(52) U.S. Cl.
CPC .............. *H05K 2201/10765* (2013.01); *H05K 2201/10772* (2013.01); *H05K 2201/10962* (2013.01); *Y02P 70/613* (2015.11); *Y10T 29/4913* (2015.01)

THREE-DIMENSIONAL STACK OF LEADED PACKAGE AND ELECTRONIC MEMBER

BACKGROUND

Technical Field

Various embodiments relate generally to an electronic device, an electronic arrangement and a method of manufacturing an electronic device.

Description of the Related Art

Packages may be denoted as encapsulated electronic chips with leads extending out of the encapsulation and being mounted to an electronic periphery, for instance on a carrier such as a printed circuit board.

There is currently a trend of miniaturization of electronic devices. Furthermore, there is a tendency to mount a plurality of electronic members such as packages on a carrier. There are various leaded packages stacking options available, but they require considerable effort, such as interposers, additional features, major design changes, etc. to enable three-dimensional (3D) stacking architectures. Furthermore, these methods are limited to stacking leaded packages.

Hence, there is still potentially room to reduce manufacturing cost and simplify processing of electronic chips to be packaged while maintaining a high accuracy of the processing.

SUMMARY

There may be a need to provide a possibility to mount packages and/or electronic members with a simple processing architecture and with a high precision.

According to an exemplary embodiment, an electronic device is provided, wherein the device comprises a package comprising an encapsulated electronic chip, at least one at least partially exposed (i.e. exposed beyond the encapsulant of the package) electrically conductive carrier lead for mounting the package on and electrically connecting the electronic chip to a carrier, and at least one at least partially exposed (i.e. exposed beyond the encapsulant of the package) electrically conductive connection lead, and an electronic member stacked with the package so as to be (in particular directly, more particularly directly by a solder bond) mounted on and electrically connected to the package by the at least one connection lead.

According to another exemplary embodiment, an electronic arrangement is provided, wherein the arrangement comprises an electronic device having the above-mentioned features, and a carrier, wherein the at least one carrier lead (in particular directly, more particularly directly by a solder bond) mounts the package on and electrically connects the electronic chip to the carrier.

According to yet another exemplary embodiment, a method of manufacturing an electronic device is provided, wherein the method comprises providing a package comprising an encapsulated electronic chip, at least one at least partially exposed electrically conductive carrier lead for (in particular directly, more particularly directly by a solder bond) mounting the package on and electrically connecting the electronic chip to a carrier, and at least one at least partially exposed electrically conductive connection lead, and stacking an electronic member with the package to thereby mount the electronic member on and electrically connect the electronic member to the package by the at least one connection lead.

An exemplary embodiment has the advantage that a first part of leads (here denoted as carrier lead(s)) extending out of an encapsulation of the package can be used for mounting a package on a carrier, and that a second part of leads (here denoted as connection lead(s)) extending out of an encapsulation of the package can be used for directly connecting an electronic member to thereby form a three-dimensional stack at least of carrier, package and electronic member. By a direct mechanical and electrical connection of the connection leads to the electronic member, the connection leads simultaneously serve as a mechanical mounting base for carrying the electronic member as well as an electrical connector for electrically coupling the package to the electronic member. Thus, a three-dimensional integration architecture is provided in which additional effort, such as interposers, additional features, major design changes, etc. is dispensable. Hence, such a mounting technology renders it possible to mount packages and/or electronic members with a simple processing architecture and with a high precision. A basic finding underlying embodiments of the invention is that, surprisingly, the mechanical robustness of the rigid leads of the package is sufficiently high to be able to mechanically carry alone at least one additional electronic member on an elevated height level, without the need of further mechanical support.

DESCRIPTION OF FURTHER EXEMPLARY EMBODIMENTS

In the following, further exemplary embodiments of the method, the device and the arrangement will be explained.

A gist of an exemplary embodiment can be seen in the provision of a 3D packaging concept for stacking a leaded package with at least one further leaded package and/or with at least one passive component. Thus, 3D packaging by stacking leaded packages is made possible, including passive electronic components such as capacitors, inductors or resistors. A corresponding stacking method forms a robust solder interconnection, with no additional interposer. Thus, stacking becomes possible with minimum structural design modification and using existing assembly process infrastructure. In addition, due to its compliance, interconnections between packages or/and passive components can be formed in particular implementing a solder process, thereby it becomes possible to provide a robust 3D package.

In an embodiment, the electronic member is a further package comprising a further encapsulated electronic chip and at least one further at least partially exposed electrically conductive connection lead connected to the at least one connection lead. Hence, the interior construction of the further package can be similar or identical to that of the before mentioned package. Thus, the described embodiment renders it possible to mount a plurality of packages on top of one another, i.e. three dimensionally stacked, with a direct mechanical and electric connection between their connection leads. Hence, a very compact and lightweight electronic arrangement may be obtained which nevertheless allows it to realize basically any desired an even sophisticated electronic function. Such a system may have a very small, in particular a smallest, footprint and may yet deliver very high, in particular maximum, functionality applications.

In an embodiment, the electronic member is a passive electronic component. Passive components may be denoted as electronic members which do not introduce net energy into a circuit. In an embodiment, they also do not rely on a source of power, except for what is available from a circuit the passive component is connected to. Passive components in particular include two-terminal components such as resistors, capacitors, inductors, and transformers. However, it is also possible that transducers, sensors, detectors, antennas, oscillators, filters, or displays are implemented as passive components. Hence, according to the described embodiment, any desired three-dimensional stacking between the at least one package and at least one further electronic member configured as passive component(s) may be achieved. In an embodiment, a respective terminal (i.e. an electrically conductive connection element, such as a lead, a pad, etc.) of the passive component may be directly connected to a corresponding connection lead of the package.

In an embodiment, the device comprises a further electronic member stacked with the electronic member so as to be (in particular directly, more particularly directly by a solder bond) mounted on and electrically connected to the electronic member. Therefore, the stacking of the electronic member and the package on the carrier may be continued in the vertical direction (i.e. in a direction perpendicular to a main surface of the carrier) at least one further height level at which the further electronic member may be located. Thus, also three stacking levels are possible. However, also the stacking of four, five or more electronic members (each of which can be a package or an electronic component) on the carrier is possible.

In an embodiment, the above-mentioned further package (as an embodiment of the electronic member) comprises at least one further at least partially exposed electrically conductive connection lead connected to the further electronic member. Therefore, also the mechanical and electrical connection between the further package and the further electronic member (i.e. between the second and third height level above the carrier) may be accomplished directly via the further connection lead(s) and hence without the requirement of additional hardware effort, such as an interposer, in between the further package and the further electronic member. This further promotes the lightweight and compact character of the resulting electronic device.

In an embodiment, the further electronic member is yet another package comprising yet another encapsulated electronic chip and yet another at least one at least partially exposed electrically conductive connection lead connected to the electronic member. Hence, the interior construction of the other package can be similar or identical to that of the package, as described above. In particular, at least three height levels of packages can be mounted on top of one another mechanically connected merely by connection leads.

In an alternative embodiment, the further electronic member is a (for instance further) passive electronic component, in particular one of the group consisting of a capacitor, an inductor, and a resistor. The interior construction as well as the electronic and mechanical connection to the periphery of the further passive electronic component can be similar or identical to that of the above-mentioned passive electronic component.

In an embodiment, the device comprises yet another electronic member arranged juxtaposed or next to (in particular at the same or substantially the same height level as) the electronic member and being (in particular directly, more particularly directly by a solder bond) mounted and electrically connected to at least one of the at least one connection lead of the package. Therefore, the three-dimensional stacking architecture described above can be refined to a sort of Y-structure to further increase the integration density by arranging, in any desired of the stack levels, multiple packages and/or passive components in a sideways array. Such multiple packages and/or passive components of one stack level may be connected with only a single package and/or passive component at the next higher and/or next lower stack level by connection leads.

In an embodiment, multiple stacks (each comprising a package and an electronic member on an elevated height level with regard to the carrier as mounting base) may be arranged adjacent to one another on the same main surface of the carrier. It is even possible that each of both opposing main surfaces of a plate-like carrier comprises one or more such stacks of electronic members (such as packages and/or passive electronic components).

In an embodiment, the electronic member is vertically stacked with the package so that an upper main surface of the package faces a lower main surface of the electronic member via a gap. In particular, the opposing main surfaces of package and electronic member facing one another may be arranged parallel so as to obtain a symmetric and therefore mechanically particularly stable configuration.

In an embodiment, the at least one further connection lead is directly connected to the at least one connection lead. In this context, the term "directly" may particularly denote that the connection leads are connected to one another without an electronic component in between. The skilled person will however understand that very small amounts of adhesion (such as solder) material or the like adhering both opposing connection leads will technically still be considered as a direct connection.

In an embodiment, the at least one further connection lead is connected to the at least one connection lead by a solder connection. Also the mechanical and electrical connection between the carrier leads and the carrier may be accomplished by soldering. More particularly, mounting and electrically connecting connection leads to one another and/or of one or more carrier leads to the carrier may be performed by a solder reflow process. Reflow soldering may be denoted as a process in which a solder paste (such as a sticky mixture of powdered solder and flux) is used to temporarily attach leads, terminals and/or the carrier to one another, after which the entire assembly may be subjected to controlled heat, which melts the solder, thereby permanently connecting the joint.

Alternatively, mounting and electrically connecting connection leads to one another may be performed by a conductive paste connection. Such a conductive paste may be an electrically conductive adhesive. For instance, such conductive paste may be made of silver or copper material.

In an embodiment, at least a part of the carrier leads and/or at least a part of the connection leads may be bent to extend along a direction or trajectory which differs from a straight extension parallel to opposing main surfaces of the package.

In an embodiment, at least one of the at least one carrier lead, and any of the above mentioned connection leads may have a shape selected from a group consisting of a gull-wing shape, a substantial U-shape, and a substantial J-shape. For instance, the carrier leads may have a gull-wing shape, i.e. may have two substantially straight and parallel lead sections with a lateral offset to one another, wherein these sections are connected to one another by a curved slanted further lead section (see for instance reference numeral 104 in FIG. 1). Substantially U-shaped or J-shaped connection leads may be bent so that two substantially straight (and for instance parallel or substantially parallel) lead sections are connected to one another by a curved (for instance substantially semicircular) further lead section (see for instance reference numeral 108 in FIG. 4).

In an embodiment, at least one of the at least one carrier lead, and the connection leads comprises at least a section which laterally extends beyond at least one of the encapsulated electronic chip, and a main body of the electronic member. At least one of the encapsulated electronic chip, and a main body of the electronic member may laterally extend beyond a connection position at which the connection leads are connected to one another. Hence, at least a part of the mechanical and electrical connection between different electronic members (such as packages and/or passive electronic components) at different height levels may be accomplished at a sideways position of the electronic members rather than within a vertical gap between electronic members at different height levels. This allows to maintain a relatively flat configuration of the electronic device while simultaneously avoiding high mechanical stress acting on the lead connections. The described embodiment may also provide good thermal dissipation for sideways position stacking of passive elements.

In an embodiment, a combination of the package and the electronic member (optionally as well as of the leads) are arranged to form an axially symmetric structure. More particularly, a respective stack of package and electronic member on a portion of the carrier including the assigned connection leads and carrier leads may be arranged in an axially symmetric configuration with a symmetry axis perpendicular to a main surface of the carrier. Such a symmetric configuration suppresses mechanical stress peaks exerted on specific sections of the electronic device.

In an embodiment, the at least one carrier lead and the at least one connection lead form part of a common lead frame (in particular a copper lead frame) having a covered section in an interior of an encapsulant encapsulating the electronic chip and having an exposed section extending beyond the encapsulant. The term "lead frame" may particularly denote a metal structure partially inside the package that carries signals from the electronic chip to the outside, and/or vice versa. The electronic chip inside the package can be glued to the lead frame, and then bond wires may attach chip pads to the leads. In a late stage of the manufacturing process, part of the lead frame may be encapsulated in an encapsulant (in particular molded in a plastic case), and outside the lead frame may be cut-off, thereby separating the leads. According to an exemplary embodiment, a part of these leads extending out of the encapsulant may then be configured (in particular bent downwardly) for connection to the carrier, and another part of these leads extending out of the encapsulant and may then be configured (in particular bent upwardly) for connection to the electronic member. Such a highly advantageous embodiment allows to simply use anyway present leads of a lead frame on which the electronic chip of the package is mounted for synergistically accomplishing the entire electrical and mechanical connection tasks for the three-dimensional stacking of the package towards a lower connection (i.e. carrier-sided) and towards an upper connection (i.e. electronic member-sided).

In an embodiment, an exposed portion of the at least one carrier lead is bent towards a first direction, in particular downwardly, and/or an exposed portion of the at least one connection lead is bent towards another second direction, in particular upwardly. The terms "upwardly" and "downwardly" may be understood in relation to a center of gravity of the encapsulant including the electronic chip, or in relation to a plane defined by a portion of the lead frame in an interior of the encapsulant. By such a bending, any application-specific configuration of the leads may be adjusted so as to flexibly adapt the horizontal and vertical positions of connection portions of the leads to the geometric conditions of a desired three-dimensional arrangement of package and electronic member with regard to the carrier.

In an embodiment, the carrier comprises one of the group consisting of a printed circuit board, a ceramic substrate, and an interposer. In the context of the present application, a "printed circuit board" (PCB) may denote a board of an electrically insulating core covered with electrically conductive material and serving for mounting thereon one or more electronic members (such as packaged electronic chips, etc.) to be electrically coupled by the electrically conductive material. More specifically, a PCB may mechanically support and electrically connect electronic components using conductive tracks, pads and other features etched from metal structures such as copper sheets laminated onto an electrically non-conductive substrate. Alternatively, the carrier is a ceramic carrier (for instance an aluminum-based ceramic carrier). It is also possible to mount the package and electronic member on another carrier, such as an interposer.

In an embodiment, the package is vertically located between the carrier and the electronic member. Therefore, a real three-dimensional integration is possible.

In yet another embodiment, the stack of the package and the electronic member may be extended by at least one further electronic member stacked on the electronic member. Hence, two, three, four or more electronic members can be stacked on top of one another, wherein at least one of the electronic members is a package and the other electronic members can be further packages and/or passive components.

In an embodiment, at least part of the electronic member and at least part of the package are globally encapsulated by further encapsulant material after the stacking. Hence, at least a part of gaps in the electronic device may be filled by a further encapsulant. Thus, the encapsulated components may be fixed in place, which can further improve the mechanical robustness, which may prevent leads from damage and which may support the removal of heat generated during operation by configuring the overall encapsulation material of a thermally conductive material.

In an embodiment, an encapsulant encapsulating the electronic chip(s) in the package(s) and/or the above mentioned global encapsulant may be an electrically insulating material. For instance, such an encapsulant may be a mold compound or a silicone casting or a polyimide-based spray coating.

The one or more electronic chips may be semiconductor chips, in particular dies. In one embodiment, the electronic chips may be used as sensors or actuators in microelectromechanical systems (MEMS), for example as pressure sensors or acceleration sensors. In another embodiment, the electronic chips may be used as semiconductor chips for power applications for instance in the automotive field and may for instance have at least one integrated insulated-gate bipolar transistor (IGBT) and/or at least one integrated diode.

In an embodiment, a first package and a second package (as an embodiment of the electronic member) may be stacked on top of each other. Each of these packages may comprise a microprocessor, a MEMS, a sensor, a logic chip, a power chip (for instance comprising an IGBT and/or a diode), a memory, etc. More particularly, the lower package may comprise a microprocessor, a logic chip, or a memory, and the upper package may comprise a MEMS, a power chip, a memory and/or a microprocessor. Other configurations are however possible.

As substrate or wafer for the electronic chips, a semiconductor substrate, preferably a silicon substrate, may be used.

Alternatively, a silicon oxide or another insulator substrate may be provided. It is also possible to implement a germanium substrate or a III-V-semiconductor material. For instance, exemplary embodiments may be implemented in GaN or SiC technology. For the packaging, moulding or encapsulation, a plastic material or a ceramic material may be used.

The above and other objects, features and advantages will become apparent from the following description and the appended claims, taken in conjunction with the accompanying drawings, in which like parts or elements are denoted by like reference numbers.

BRIEF DESCRIPTION OF THE DRAWINGS

The accompanying drawings, which are included to provide a further understanding of exemplary embodiments and constitute a part of the specification, illustrate exemplary embodiments.

In the drawings.

DETAILED DESCRIPTION

Figure 1:
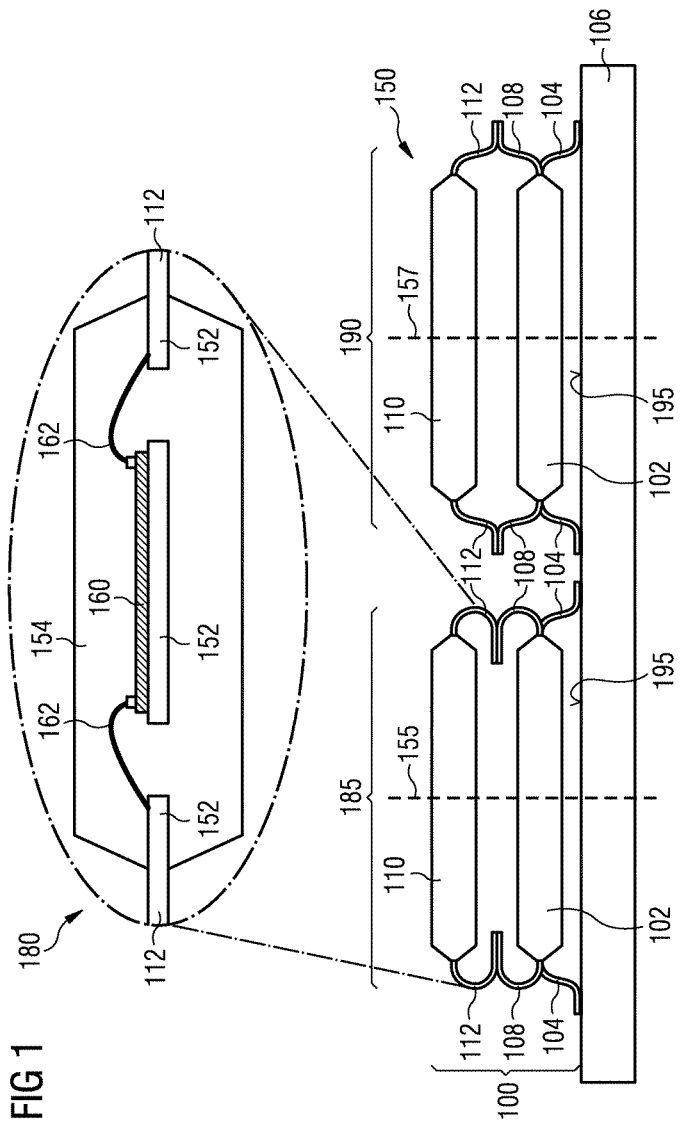
FIG. 1 shows a side view of an arrangement comprising an electronic device and a carrier according to an exemplary embodiment.

The illustration in the drawing is schematically and not to scale.

FIG. 1 shows a side view of an arrangement 150 according to an exemplary embodiment.

The arrangement 150 comprises an electronic device 100, embodied as a set of two stacks 185, 190, each comprising a first package 102 and an electronic member 110 which is here configured as a second package. The arrangement 150 furthermore comprises a carrier 106, embodied as a printed circuit board (PCB).

The electronic device 100 is here constituted of the two juxtaposed stacks 185, 190 of the vertically mounted packages 102, 110. A detail 180 in FIG. 1 illustrates the internal construction of the upper left package 110 in FIG. 1, wherein any other of the packages 102, 110 may have a similar or identical construction (with the mere exemption that lead frame sections outside of the respective package 102, 110 may be bent and connected individually so as to fulfill a respectively assigned mounting and electrical coupling task). Each of the packages 102, 110 comprises an encapsulated electronic chip 160, i.e. a semiconductor die encapsulated within an encapsulation or encapsulant 154 such as a mold. In one embodiment, the respective first package 102 has an electronic chip 160 which is configured as a memory, a microprocessor or a logic chip. Furthermore, the respective second package or electronic member 110 may have an electronic chip 160 which can be a memory a MEMS, a power chip, or a microprocessor. It is also possible that multiple electronic chips 160 are encapsulated in one of the packages 102, 110.

The respective electronic chip 160 is mounted on a central portion of a lead frame 152 (which may comprise or consist of copper) and is connected, via bond wires 162, to peripheral portions of the lead frame 152. These peripheral portions of the lead frame 152 extend partially within, and partially outside of the encapsulant 154. The sub-portions outside of the encapsulant 154 serve as connection leads 112 in case of the respective second package or electronic member 110, or as connection leads 108 and/or as carrier leads 104 in case of the respective first package 102, as will be described below in further detail.

More specifically, each of the lower level or first packages 102 of the stacks 185, 190 comprises partially exposed electrically conductive gull-wing shaped and downward bent carrier leads 104 mounting the respective package 102 directly on and electrically connecting the respective electronic chip 160 to electrically conductive pads (not explicitly shown) of the carrier 106, for instance by reflow soldering.

Moreover, each of the lower level or first packages 102 of the stacks 185, 190 comprises partially exposed electrically conductive upward bent connection leads 108. In case of the stack 185, the upward bent connection leads 108 are substantially U-shaped, whereas they are gull-wing shaped in case of the stack 190.

Beyond this, each of the stacks 185, 190 comprises the respective electronic member 110 (which for both stacks 185, 190 is embodied as second package) vertically spaced with regard and stacked with the respective first package 102 so as to be mounted on and electrically connected to the respective package 102 by the respective connection leads 108 of the respective first package 102. More specifically, the latter mechanical and electric connection between the respective first package 102 and the respective electronic member 110 of a respective stack 185, 190 is accomplished by a direct electrical solder connection (preferably formed by reflow soldering) between the respective connection leads 108 of the respective first package 102 and respective further connection leads 112 of the respective electronic member 110. In the stack 185, the second package or electronic member 110 has substantially U-shaped downward bent electrically conductive further connection leads 112. In the stack 190, the second package or electronic member 110 has gull-wing shaped downward bent electrically conductive further connection leads 112.

Hence, for each of the packages 102, 110 of FIG. 1, the respective carrier leads 104 and/or connection leads 108, 112 form part of a respective common lead frame 152 having a covered section in an interior of encapsulant 154 encapsulating the electronic chip 160 and having an exposed section extending beyond the encapsulant 154. This allows to accomplish the mounting and electric coupling of the arrangement 150 in a lightweight and simple way.

The respective first package 102 is consequently vertically located between (and spaced with regard to) the carrier 106 and (spaced with regard to) the respective electronic member 110 so as to obtain a vertical stack arrangement 150 of packages 102, 110 with mechanical and electrical connections being made exclusively by leads 104, 108, 112 of the packages' lead frames.

Furthermore, by forming multiple stacks 185, 190 on the same main surface 195 of the carrier 106, a highly compact and lightweight configuration is obtained.

As can be taken from FIG. 1, the respective second package or electronic member 110 is vertically stacked with the respective first package 102 so that an upper main surface of the respective first package 102 faces a lower main surface of the respective second package or electronic member 110. As can furthermore be taken from FIG. 1, the carrier leads 104 and the connection leads 108, 112 laterally or sideways (i.e. along a horizontal direction of FIG. 1) extend beyond the encapsulant 154 of the respective first package 102 and the respective second package or electronic member 110.

Moreover, for each of the stacks 185, 190, the respective first package 102 and the respective second package or electronic member 110 are arranged to form an axially symmetric and hence extremely mechanically stable structure, compare respective symmetry axes 155, 157.

In one embodiment, the electronic device 100 as well as the arrangement 150 shown in FIG. 1 may remain as they are, i.e. non-encapsulated, so that gaps between the various components in horizontal and/or vertical direction remain in the final product. Alternatively, the electronic device 100 as well as the arrangement 150 shown in FIG. 1 may be made subject to a further encapsulation (not shown) so that at least a part of the gaps between the various components in horizontal and/or vertical direction may be filled by an encapsulant. The latter embodiment may have the advantage that the encapsulated components are fixed in place, which can further improve the mechanical robustness and which may support the removal of heat generated during operation by configuring the overall encapsulation of a thermally conductive material.

In particular, the interconnections between the connection leads 108, 112 may be advantageously formed by a solder reflow process, which is very compliant and allows to obtain a high reliability. Furthermore, the concept of downward bent leads 104, 112 in combination with upward bent leads 108 for connection of a top package (respective second package or electronic member 110) and a bottom package (respective first package 102) to one another provides for a stacking architecture with minimum structural design modification, using existing assembly process infrastructure and provides very robust 3D electronic devices 100 and arrangements 150.

Figure 2:
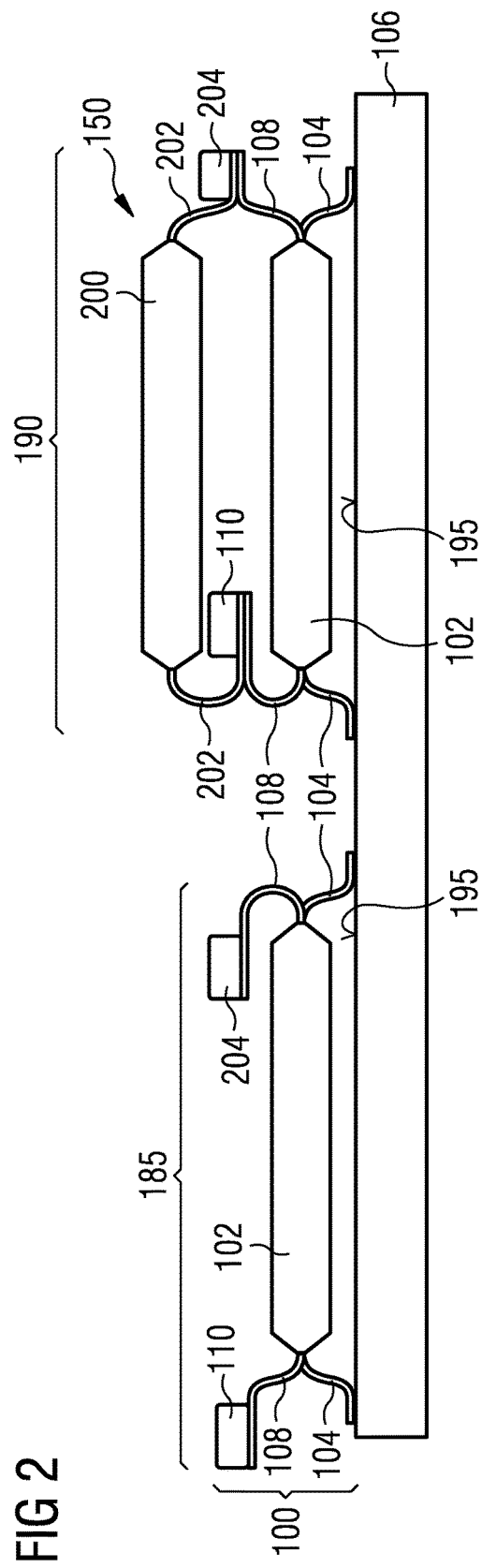
FIG. 2 shows a side view of an arrangement comprising an electronic device and a carrier according to another exemplary embodiment.

FIG. 2 shows a side view of an arrangement 150 comprising an electronic device 100 and a carrier 106 according to another exemplary embodiment.

The arrangement 150 of FIG. 2 differs from the arrangement 150 of FIG. 1 in that, for both stacks 185, 190 in FIG. 2, the electronic member 110 is a passive electronic component such as a capacitor, an inductor, or a resistor, rather than a further package. As can be taken from FIG. 2, for both stacks 185, 190, a part of the upwardly bent connection leads 108 of the package 102 are connected directly, for instance by soldering, to respective terminals (not shown) of the respective electronic member 110.

A further difference between the embodiment of FIG. 2 and the embodiment of FIG. 1 is that each of the stacks 185, 190 of the electronic device 100 according to FIG. 2 additionally comprises a further electronic member 204, also embodied as a passive electronic component, stacked with the package 102 and connected with a part of the connection leads 108 so as to be arranged substantially at the same height level as the electronic member 110 which is connected with another part of the connection leads 108.

Yet a further difference between the embodiment of FIG. 2 and the embodiment of FIG. 1 is that the stack 190 of the electronic device 100 according to FIG. 2 additionally comprises yet a further package 200, also comprising an encapsulated electronic chip, stacked with the package 102 and the passive electronic components (see reference numerals 110, 204). The package 200 has downwardly bent connection leads 202 (a part of which being of a substantially U-shape, another part of gull-wing shape) connected with a respective part of the connection leads 108 and/or with respective terminals (not shown) of the respective passive electronic components (see reference numerals 110, 204).

Thus, stack 185 of FIG. 2 comprises two levels of electronic components on the carrier 106, i.e. a first level corresponding to reference numeral 102, and a second level corresponding to reference numerals 110, 204 interconnected to one another exclusively by leads 104, 108 of a common lead frame 152 in an interior of the package 102.

Correspondingly, stack 190 of FIG. 2 comprises three levels of electronic components on the carrier 106, i.e. a first level corresponding to reference numeral 102, a second level corresponding to reference numerals 110, 204, and a third level corresponding to reference numeral 200, interconnected to one another exclusively by leads 104, 108, 202 of respective lead frames 152 in an interior of the packages 102, 200.

It should be said that solder joins that connect top and bottom packages, and passive components to bottom package are not shown in FIG. 1 and FIG. 2.

Figure 3:
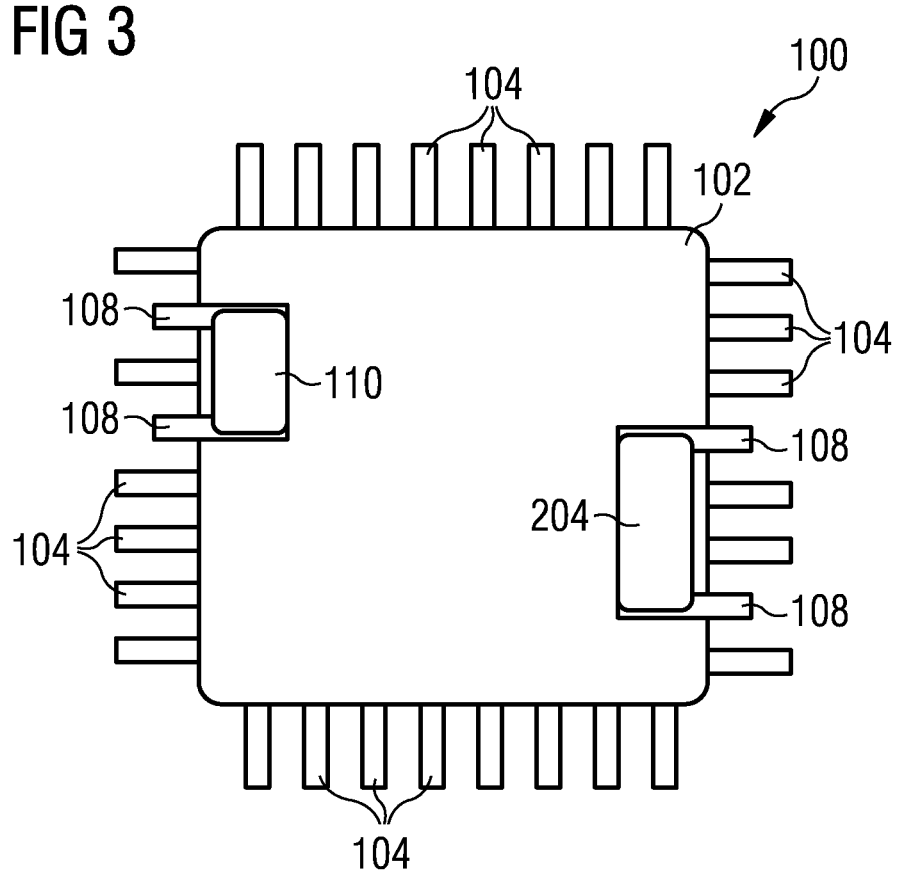
FIG. 3 shows a plan view of an electronic device according to an exemplary embodiment.
Figure 4:
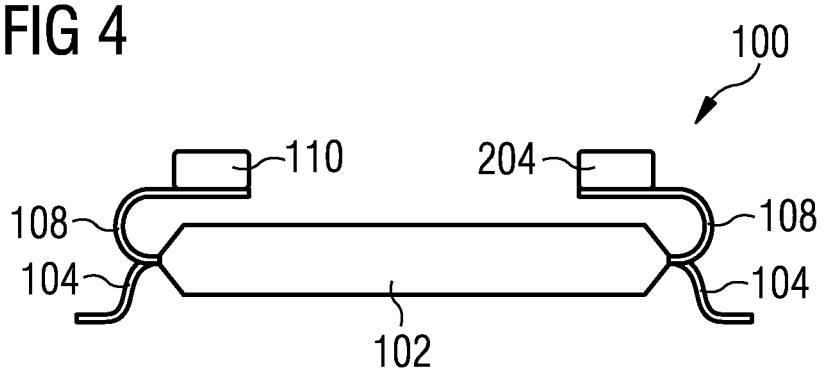
FIG. 4 shows a side view of the electronic device of FIG. 3.

FIG. 3 shows a plan view of an electronic device 100 according to an exemplary embodiment. FIG. 4 shows a corresponding side view of the electronic device 100 of FIG. 3.

The electronic device 100 shown in FIG. 3 and FIG. 4 basically corresponds to the stack 185 of FIG. 2 with the difference that the connection leads 108 are both bent inwardly according to FIG. 4 so as to have a substantially U-shape. Moreover, the electronic device 100 of FIG. 3 and FIG. 4 is not yet mounted on a carrier 106. FIG. 3 shows that the carrier leads 104 extend out of all four lateral surfaces of the encapsulation of the package 102. In the shown embodiment, the connection leads 108 for connecting the passive electronic components (see reference numerals 110, 204) extend out of only two opposing lateral surfaces of the encapsulation of the package 102.

Thus, FIG. 3 and FIG. 4 show a leaded package 102 with passive components (see reference numerals 110, 204) stacking. The connection leads 108 that connect the passive components (see reference numerals 110, 204) can be designed in accordance with the size of the passive components.

Figure 5:
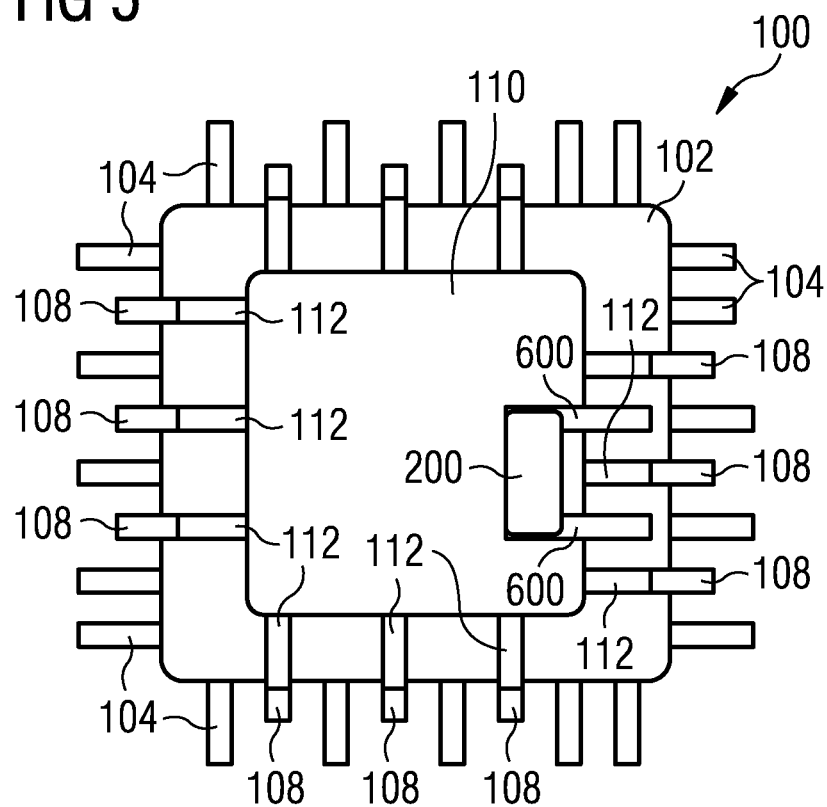
FIG. 5 shows a plan view of an electronic device according to another exemplary embodiment.
Figure 6:
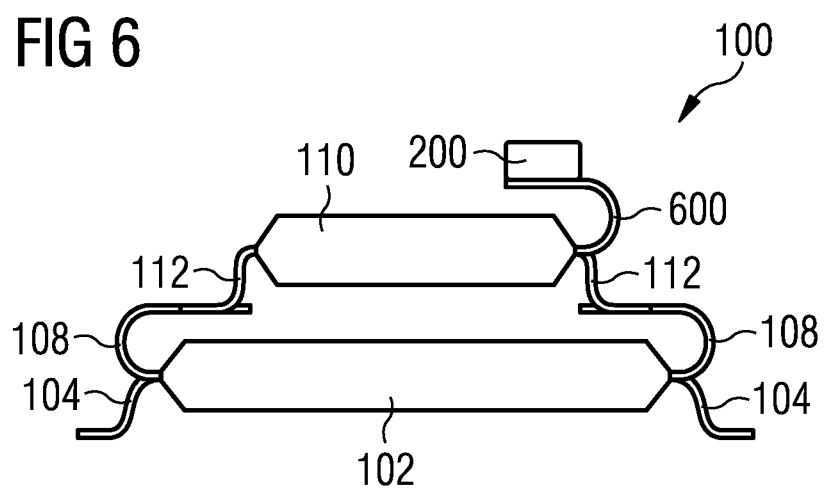
FIG. 6 shows a side view of the electronic device of FIG. 5.

FIG. 5 shows a plan view of an electronic device 100 according to yet another exemplary embodiment. FIG. 6 shows a side view of the electronic device 100 of FIG. 5.

The embodiment of FIG. 5 and FIG. 6 relates to a three-dimensional stacking architecture of a first package 102 on a bottom level, a second package as electronic member 110 on intermediate level, and a passive electronic component as a further electronic member 200 on a top level. The connection between the bottom level and a carrier 106 (not shown) can be accomplished by the carrier leads 104 which form part of the same lead frame to which also connection leads 108 of the first package 102 belong, which, in turn, are directly connected to the further connection leads 112 of another lead frame of the second package as electronic member 110 on the intermediate level. The latter lead frame, in turn, not only comprises the downwardly bent further connection leads 112, but also yet other upwardly bent connection leads 600 which are connected to terminals (not shown) of the further electronic member 200 on top level.

Thus, FIG. 5 and FIG. 6 show a bottom leaded package 102, stacked with another package 110, followed by a further electronic member 200 embodied as a passive electronic component. Different top package size can be accommodated by designing a different lead length of the bottom package.

It should be noted that the term "comprising" does not exclude other elements or features and the "a" or "an" does not exclude a plurality. Also elements described in association with different embodiments may be combined. It should also be noted that reference signs shall not be construed as limiting the scope of the claims. Moreover, the scope of the present application is not intended to be limited to the particular embodiments of the process, machine, manufacture, composition of matter, means, methods and steps described in the specification. Accordingly, the appended claims are intended to include within their scope such processes, machines, manufacture, compositions of matter, means, methods, or steps.

What is claimed is:

1. An electronic device, the device comprising:
   a package comprising an encapsulated electronic chip, at least one at least partially exposed electrically conductive carrier lead for mounting the package on and electrically connecting the electronic chip to a carrier, and at least one at least partially exposed electrically conductive connection lead;
   an electronic member stacked with the package so as to be mounted on and electrically connected to the package by the at least one connection lead;
   another electronic member arranged juxtaposed to the electronic member and being mounted and electrically connected to at least one of the at least one connection lead of the package.

2. The device according to claim 1, wherein the electronic member is a further package comprising a further encapsulated electronic chip and at least one further at least partially exposed electrically conductive connection lead connected to the at least one connection lead.

3. The device according to claim 1, wherein the electronic member is a passive electronic component, in particular one of the group consisting of a capacitor, an inductor, and a resistor.

4. The device according to claim 1, comprising a further electronic member stacked with the electronic member and the package so as to be mounted on and electrically connected to the electronic member.

5. The device according to claim 4, wherein the electronic member is a further package comprising a further encapsulated electronic chip and at least one further at least partially exposed electrically conductive connection lead connected to the at least one connection lead, and wherein the further package comprises yet another at least one at least partially exposed electrically conductive connection lead connected to the further electronic member.

6. The device according to claim 4, wherein the further electronic member is yet another package comprising yet another encapsulated electronic chip and yet another at least one at least partially exposed electrically conductive connection lead connected to the electronic member.

7. The device according to claim 4, wherein the further electronic member is a further passive electronic component, in particular one of the group consisting of a capacitor, an inductor, and a resistor.

8. The device according to claim 1, wherein the electronic member is vertically stacked with the package so that an upper main surface of the package faces a lower main surface of the electronic member.

9. The device according to claim 2, wherein the at least one further connection lead is directly connected to the at least one connection lead.

10. The device according to claim 2, wherein the at least one further connection lead is connected to the at least one connection lead by a solder connection, in particular formed by a solder reflow process, or by a conductive paste connection.

11. The device according to claim 1, wherein at least one of the at least one carrier lead, and the connection leads has a shape selected from a group consisting of a gull-wing shape, a substantial U-shape, and a substantial J-shape.

12. The device according to claim 1, wherein at least one of the at least one carrier lead, and the connection leads comprises at least a section which laterally extends beyond at least one of the encapsulated electronic chip, and a main body of the electronic member.

13. The device according to claim 1, wherein the package and the electronic member, in particular additionally at least part of the leads, are arranged to form an axially symmetric structure.

14. The device according to claim 1, wherein the at least one carrier lead and the at least one connection lead form part of a common lead frame having a covered section in an interior of an encapsulant encapsulating the electronic chip and having an exposed section extending beyond the encapsulant.

15. The device according to claim 1, wherein an exposed portion of the at least one carrier lead is bent towards a first direction, in particular downwardly, and/or an exposed portion of the at least one connection lead is bent towards another second direction, in particular upwardly.

16. An electronic arrangement, the arrangement comprising:
    an electronic device according to claim 1;
    a carrier, wherein the at least one carrier lead mounts the package on and electrically connects the electronic chip to the carrier.

17. The arrangement according to claim 16, wherein the carrier comprises one of the group consisting of a printed circuit board, a ceramic substrate, and an interposer.

18. A method of manufacturing an electronic device, the method comprising:
    providing a package comprising an encapsulated electronic chip, at least one at least partially exposed electrically conductive carrier lead for mounting the package on and electrically connecting the electronic chip to a carrier, and at least one at least partially exposed electrically conductive connection lead;
    stacking an electronic member with the package to thereby mount the electronic member on and electrically connect the electronic member to the package by the at least one connection lead;
    stacking another electronic member juxtaposed to the electronic member to thereby mount the further electronic member on and electrically connect the further electronic member to the package by the at least one connection lead.

19. The method according to claim 18, further comprising encapsulating at least part of the electronic member and at least part of the package after the stacking.

* * * * *